(12) United States Patent
Ryat

(10) Patent No.: US 7,915,953 B2
(45) Date of Patent: Mar. 29, 2011

(54) AMPLIFIER CIRCUIT AND METHOD THEREFOR

(75) Inventor: Marc Henri Ryat, Toulouse (FR)

(73) Assignee: Semiconductor Components Industries, LLC, Phoenix, AZ (US)

( * ) Notice: Subject to any disclaimer, the term of this patent is extended or adjusted under 35 U.S.C. 154(b) by 407 days.

(21) Appl. No.: 12/091,152

(22) PCT Filed: Aug. 20, 2007

(86) PCT No.: PCT/US2007/076312
§ 371 (c)(1),
(2), (4) Date: Apr. 22, 2008

(87) PCT Pub. No.: WO2009/025665
PCT Pub. Date: Feb. 26, 2009

(65) Prior Publication Data
US 2010/0148861 A1    Jun. 17, 2010

(51) Int. Cl.
*H03F 1/14* (2006.01)

(52) U.S. Cl. .................. 330/51; 330/124 R; 330/149
(58) Field of Classification Search .............. 330/51, 330/124 R, 149; 381/94.5, 121, 111
See application file for complete search history.

(56) References Cited

U.S. PATENT DOCUMENTS

| 5,939,938 | A * | 8/1999 | Kalb et al. ............... 330/51 |
| 7,167,569 | B1 * | 1/2007 | Seven ...................... 381/111 |
| 7,259,619 | B2 * | 8/2007 | Chang et al. ............. 330/51 |

* cited by examiner

*Primary Examiner* — Robert Pascal
*Assistant Examiner* — Hieu P Nguyen
(74) *Attorney, Agent, or Firm* — Robert F. Hightower

(57) ABSTRACT

In one embodiment, an amplifier circuit is formed to minimize pop and click noise on the outputs of the amplifier circuit. The amplifier circuit is configured to place an output stage of the amplifier circuit in a high impedance state to minimize the pop and click noise. In another embodiment, the amplifier circuit is configured to couple the inputs of two amplifiers together to minimize the pop and click noise.

16 Claims, 10 Drawing Sheets

US 7,915,953 B2

AMPLIFIER CIRCUIT AND METHOD THEREFOR

BACKGROUND OF THE INVENTION

The present invention relates, in general, to electronics, and more particularly, to methods of forming semiconductor devices and structure.

In the past, the semiconductor industry utilized various methods and circuits to form audio amplifiers. These audio amplifiers generally received an input signal and differentially drove a speaker in order to form sound. Examples of such audio amplifiers were disclosed in U.S. Pat. No. 5,939,938 issued to Kalb et al. on Aug. 17, 1999 and in U.S. Pat. No. 6,346,854 issued to Christopher B. Heitoffl on Feb. 12, 2002. One problem with these prior audio amplifiers was turn-on and turn-off transients that created noise during the turn-on and turn-off time. The turn-on and turn-off transients produced noises generally referred to as pop or click noises which degraded the usability of the audio amplifier.

Accordingly, it is desirable to have an amplifier that reduces the turn-on and turn-off transients and the pop and click noise.

For simplicity and clarity of the illustration, elements in the figures are not necessarily to scale, and the same reference numbers in different figures denote the same elements. Additionally, descriptions and details of well-known steps and elements are omitted for simplicity of the description. As used herein current carrying electrode means an element of a device that carries current through the device such as a source or a drain of an MOS transistor or an emitter or a collector of a bipolar transistor or a cathode or anode of a diode, and a control electrode means an element of the device that controls current through the device such as a gate of an MOS transistor or a base of a bipolar transistor. Although the devices are explained herein as certain N-channel or P-Channel devices, a person of ordinary skill in the art will appreciate that complementary devices are also possible in accordance with the present invention. It will be appreciated by those skilled in the art that the words during, while, and when as used herein are not exact terms that mean an action takes place instantly upon an initiating action but that there may be some small but reasonable delay, such as a propagation delay, between the reaction that is initiated by the initial action.

DETAILED DESCRIPTION OF THE DRAWINGS

Figure 1:
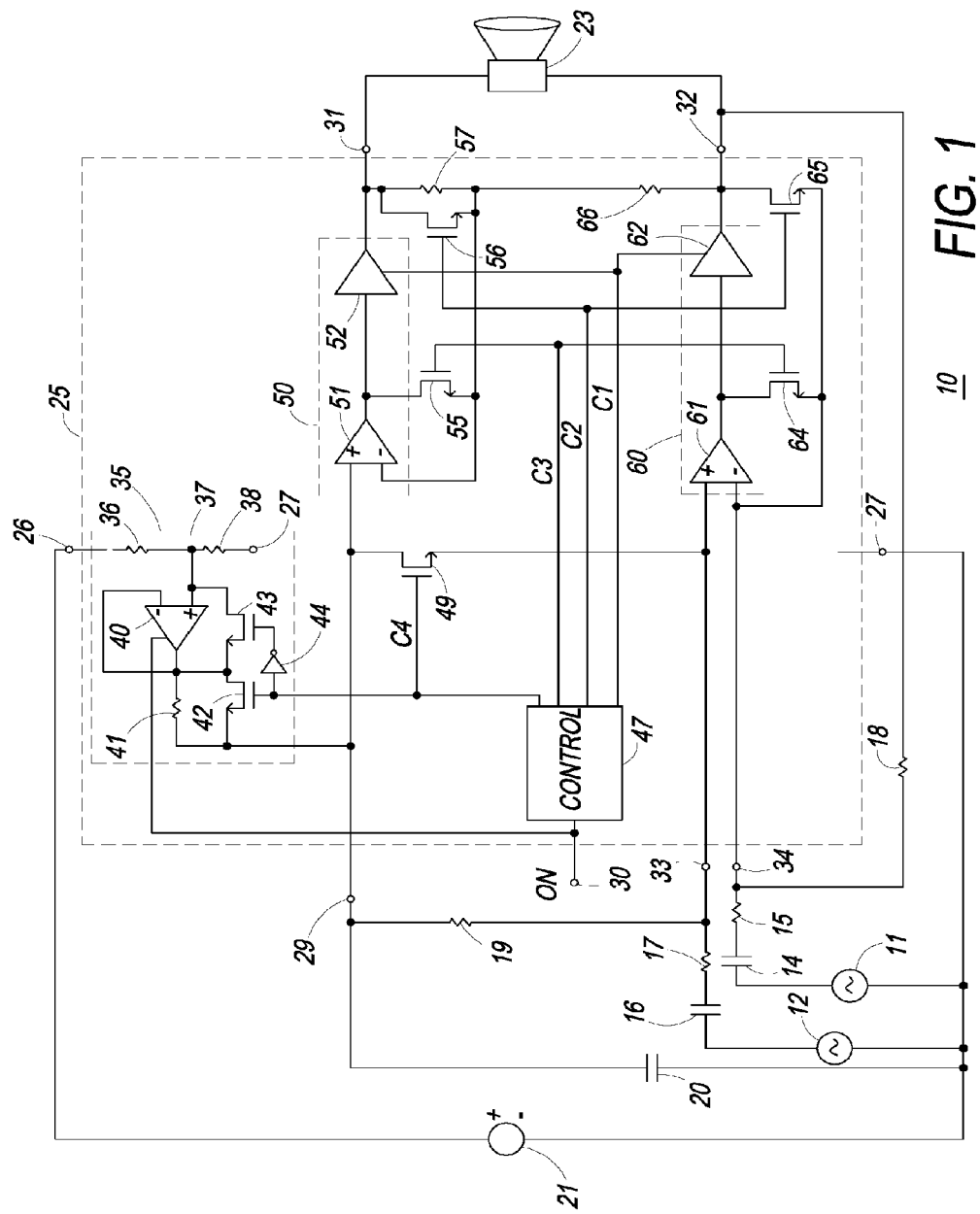
FIG. 1 schematically illustrates an embodiment of a portion of a system that has an exemplary embodiment of an amplifier circuit in accordance with the present invention.

FIG. 1 schematically illustrates an embodiment of a portion of an amplifier system 10 that uses an exemplary embodiment of an amplifier circuit 25 to amplify signals received by circuit 25 and to drive a load with the amplified signals. Typically, circuit 25 receives audio signals and drives an audio load such as an audio speaker 23. Amplifier circuit 25 receives power, such as from a DC voltage source 21, between a voltage input 26 and a voltage return 27. Thus, circuit 25 operates from a single voltage power source. A bypass capacitor 20 generally is utilized to assist in forming a stable reference voltage for the operation of circuit 25. In the exemplary embodiment illustrated in FIG. 1, system 10 provides a differential input signal that is to be amplified as illustrated by differential signal sources 11 and 12. Sources 11 and 12 typically are audio signal sources. Blocking capacitors 14 and 16 decouple DC voltages of respective sources 11 and 12 from the inputs of circuit 25. Input resistors 15 and 17 are connected between respective capacitors 14 and 16 and the inputs to circuit 25.

Circuit 25 receives the input signals on signal inputs 33 and 34. Circuit 25 also includes a bypass input 29, a turn-on input 30, and differential outputs 31 and 32. Circuit 25 further includes a bypass buffer 35, a first multi-stage amplifier 60, a second multi-stage amplifier 50, and a clock control circuit or control 47. Bypass buffer 35 includes a reference voltage source formed as a resistor divider using resistors 36 and 38 that form a reference voltage at a node 37, an amplifier 40, an output resistor 41, a switch such as a switch transistor 42, another switch such as a switch transistor 43, and an inverter 44. First multi-stage amplifier 60 includes a plurality of amplifier stages connected together in series with feedback elements in order to provide sufficient gain and drive to amplify the input signals and drive the load of speaker 23. Amplifier 60 includes a first amplifier 61, such as a trans-conductance amplifier, an output stage amplifier 62, such as a trans-conductance amplifier, and an output resistor 66. An external resistor 18 is connected between output 32 and input 34 and functions as a feedback resistor for amplifier 60. Amplifier 50 includes a first amplifier 51, such as a trans-conductance amplifier, an output stage amplifier 52, such as a trans-conductance amplifier, and a feedback resistor 57. Although amplifiers 50 and 60 are illustrated with two stages of amplifiers, 51 and 52 and 61 and 62, amplifiers 50 and 60 may include any number of intermediate amplifier stages in addition to amplifiers 51 and 52 and amplifiers 61 and 62. Output stage amplifiers 52 and 62 may have a variety of configurations including a differential amplifier or a simple general gain stage. Additionally, output stage amplifiers 52 and 62 are each formed with an enable control input that is used to control the output transistors of respective amplifiers 52 and 62. When the enable control input is negated, the output transistors of amplifiers 52 and 62 are disabled which places the output of amplifiers 52 and 62 in a high impedance state so that amplifiers 52 and 62 do not drive outputs 31 and 32. When the enable control signal is asserted, the output transistors of amplifiers 52 and 62 are enabled so that amplifiers 52 and 62 drive outputs 31 and 32 responsively to the signals on the inputs to amplifiers 52 and 62. Control 47 generates a plurality of control signals there used to control the startup sequence of circuit 25. The control signals form three operating states that are utilized to sequence the operation of some of the elements of circuit 25 in order to minimize pop and click noise on outputs 31 and 32. Control 47 generally includes a clock circuit that forms a timing reference signal and digital logic that uses the timing reference signal to form the time intervals of the different operating states. Circuit 25 also includes switches, implemented as switch transistors 49, 55, 56, 64, and 65, that also assist in the start-up sequencing of circuit 25. Although not illustrated in the exemplary embodiment of FIG. 1, those skilled in the art will appreciate that most of the elements of circuit 25, such as control 47 and amplifiers 50 and 60, are connected to receive power between input 26 and return 27.

Figure 2:
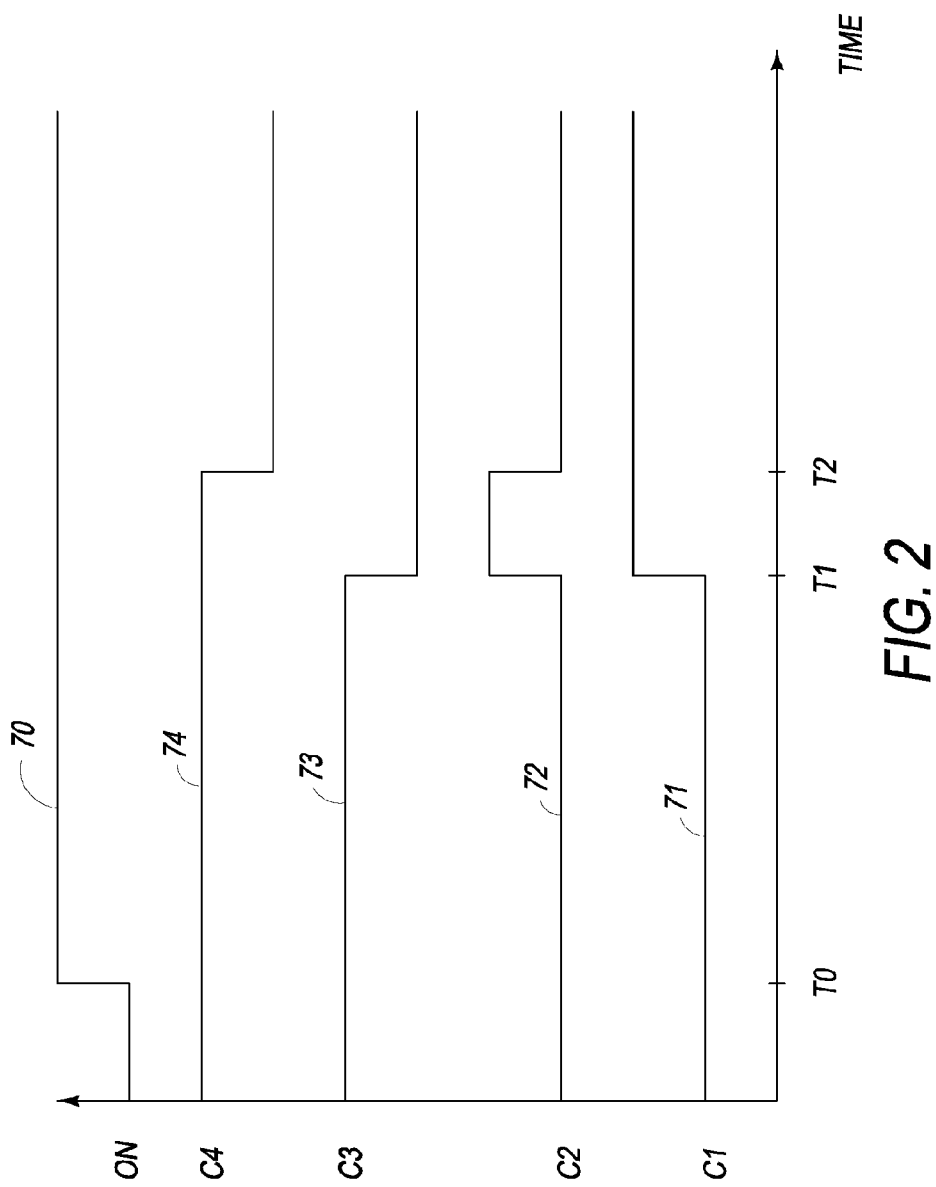
FIG. 2 is a graph illustrating states of some of the signals formed by the amplifier circuit of FIG. 1 in accordance with the present invention.

FIG. 2 is a graph having plots that illustrate some states of some of the signals formed by circuit 25. The abscissa indicates time and the ordinate indicates increasing amplitude of the illustrated signal. A plot 70 illustrates the turn-on input signal (ON) on input 30 of circuit 25. Plots 71, 72, 73, and 74 illustrate respective control signals C1, C2, C3, and C4 that are formed on outputs of control 47. This description has references to FIG. 1 and FIG. 2. Prior to circuit 25 receiving power from source 21 between input 26 and return 27, bypass capacitor 20 is discharged and input capacitors 14 and 16 are also discharged. Circuit 25 is configured to form a plurality of operating states during a start-up sequence. These different operating states are formed to minimize the pop and click noise formed by speaker 23.

Figure 3:
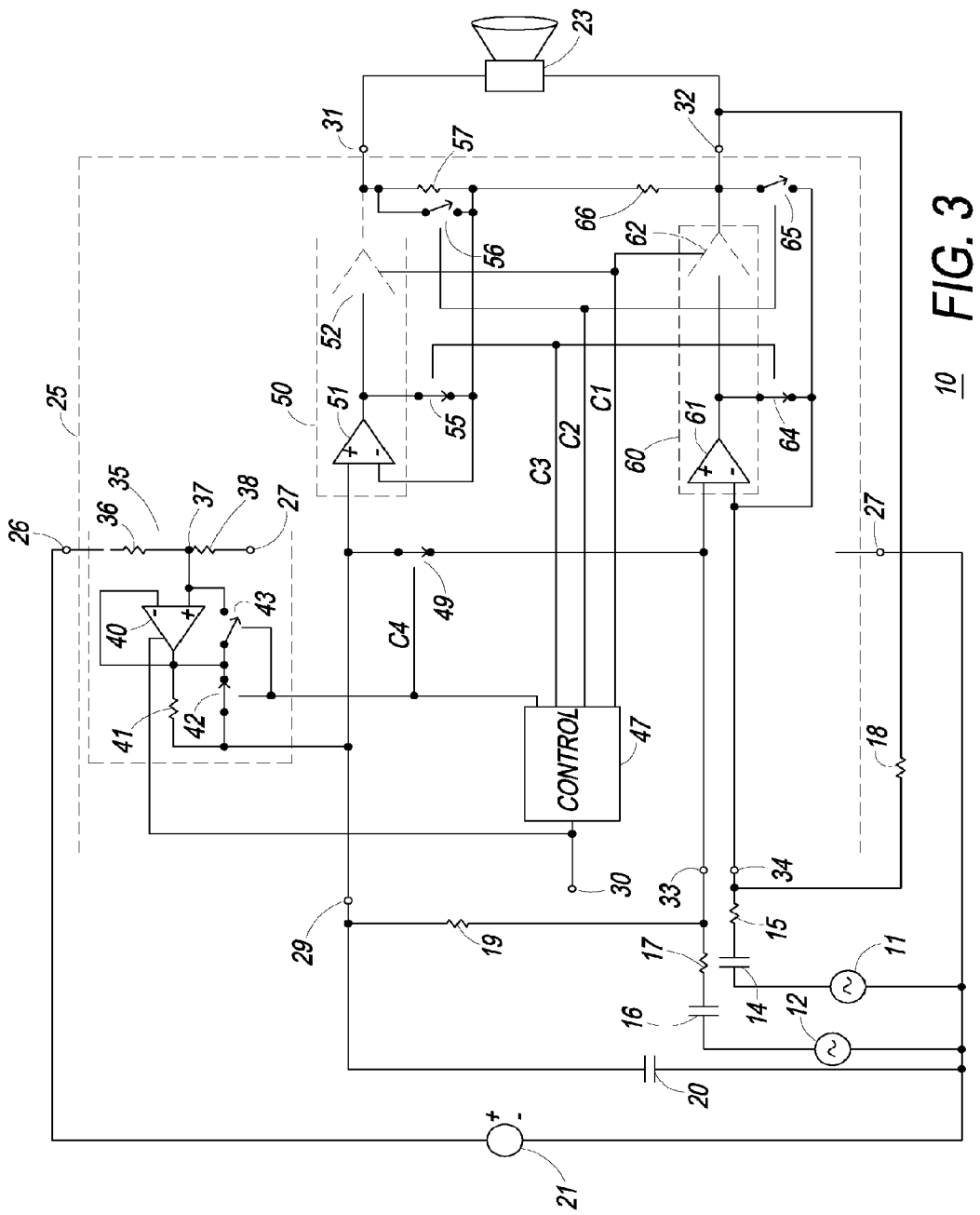
FIG. 3-FIG. 5 schematically illustrate different states of the amplifier circuit of FIG. 1 in accordance with the present invention.

FIG. 3 schematically illustrates system 10 during a first operating state of circuit 25. In FIG. 3, transistors 42, 43, 49, 55, 56, 64, and 65 are illustrated by switches that show the state (enabled or disabled) of the respective transistors responsively to the control signals of control 47. Referring to FIG. 2 and FIG. 3, at a time T0 source 21 begins to apply power to circuit 25 and input 30 is driven high to signal circuit 25 to turn-on and begin the startup sequence. Since capacitors 14, 16, and 20 are discharged, circuit 25 must charge the capacitors and at the same time prevent forming output signals on outputs 31 and 32 that would drive speaker 23. The low to high transition of the ON signal causes control 47 to place signals C1, C2, C3, and C4 in a first state, as illustrated between T0 and a time T1 in FIG. 2, and cause control circuit 25 to operate in the first operating state. The high ON signal also enables buffer 40 to begin operating. In this first state, signals C1 and C2 are low, and signals C3 and C4 are high. The low C1 signal disables the output of amplifiers 52 and 62 and places the output of amplifiers 52 and 62 in a high impedance state so that amplifiers 52 and 62 supply no current and do not drive to outputs 31 and 32. Thus, outputs 31 and 32 are not driven and circuit 25 does not generate any noise through speaker 23. Amplifiers 52 and 62 are illustrated by dashed lines to represent that the outputs are in a high impedance state and do not drive outputs 31 and 32. The low C2 signal disables transistors 56 and 65. The high C3 signal enables transistors 55 and 64 which connects the output of respective amplifiers 51 and 61 to the respective inverting input of amplifiers 51 and 61. The high C4 signal enables transistor 42 and disables transistor 43 which connects amplifier 40 in a unity gain configuration. The high C4 signal also enables transistor 49 which connects the non-inverting input of amplifier 51 to the non-inverting input of amplifier 61. Thus, amplifiers 51 and 61 are connected in a closed loop follower configuration. In this configuration, the output of amplifiers 51 and 61 follows the voltage on input 29.

As the voltage from voltage source 21 increases, the divider of resistors 36 and 38 forms an increasing voltage on node 37. Amplifier 40 receives the voltage from node 37 and drives input 29 and capacitor 20. Amplifier 40 has a sufficient current drive capability to drive capacitor 20 so that the voltage on input 29 increases at a rate that is sufficient for the voltage at input 29 to reach the voltage of node 37 and to settle within a fraction of the time interval between times T0 and T1. Because of the follower configuration of amplifiers 51 and 61 and because transistor 49 is enabled, capacitors 14 and 16 are also charged to the voltage that buffer 35 forms on input 29. Thus, all of the capacitors are charged to the same voltage over the same time interval. In the preferred embodiment, resistors 36 and 38 have approximately equal values, thus, the voltage on node 37 is approximately one-half of the voltage provided by source 21.

In this configuration, the gain of any differential signal resulting from an imbalance in the voltages on the outputs of amplifiers 51 and 61 to the signal formed across speaker 23 is set by the resistance of speaker 23 and resistors 66 and 18 as shown by the equation below:

$$V31-V32=(V51-V61)(R23/(R66+2R18))$$

where;
 V51−V61=the differential voltage between the output of amplifier 51 and the output of amplifier 61;
 V31−V32=the differential voltage between outputs 31 and 32;
 R23=the resistance of speaker 23;
 R18=the resistance of resistor 18; and
 R66=the resistance of resistor 66.

Those skilled in the art will appreciate that this gain shown above is the gain between the differential input signal from inputs 33 and 34 to the differential output signal between outputs 31 and 32.

In one example embodiment, resistor 66 is twenty thousand (20,000) ohms, resistor 18 is ten thousand (10,000) ohms, and the resistance of speaker 23 is about eight (8) ohms. Thus, the equation reduces to:

$$V31 - V32 = (V51 - V61)(8/(20000 + 20000))$$
$$= (V51 - V61)/5000.$$

Thus, even if there were a differential signal between the outputs of amplifiers 51 and 61 the gain is so small, that this signal would not be heard.

Control 47 maintains circuit 25 in this first operating state for time interval that is sufficient for the voltage on input 29 to reach the desired operating value and for circuit 25 to charge capacitors 14, 16, and 20 to the voltage on node 37. Control 47 determines the time interval as function of time and not a function of any voltage values. Control 47 subsequently changes the state of the control signals to place circuit 25 in the second operating state of the start-up sequence.

Figure 4:
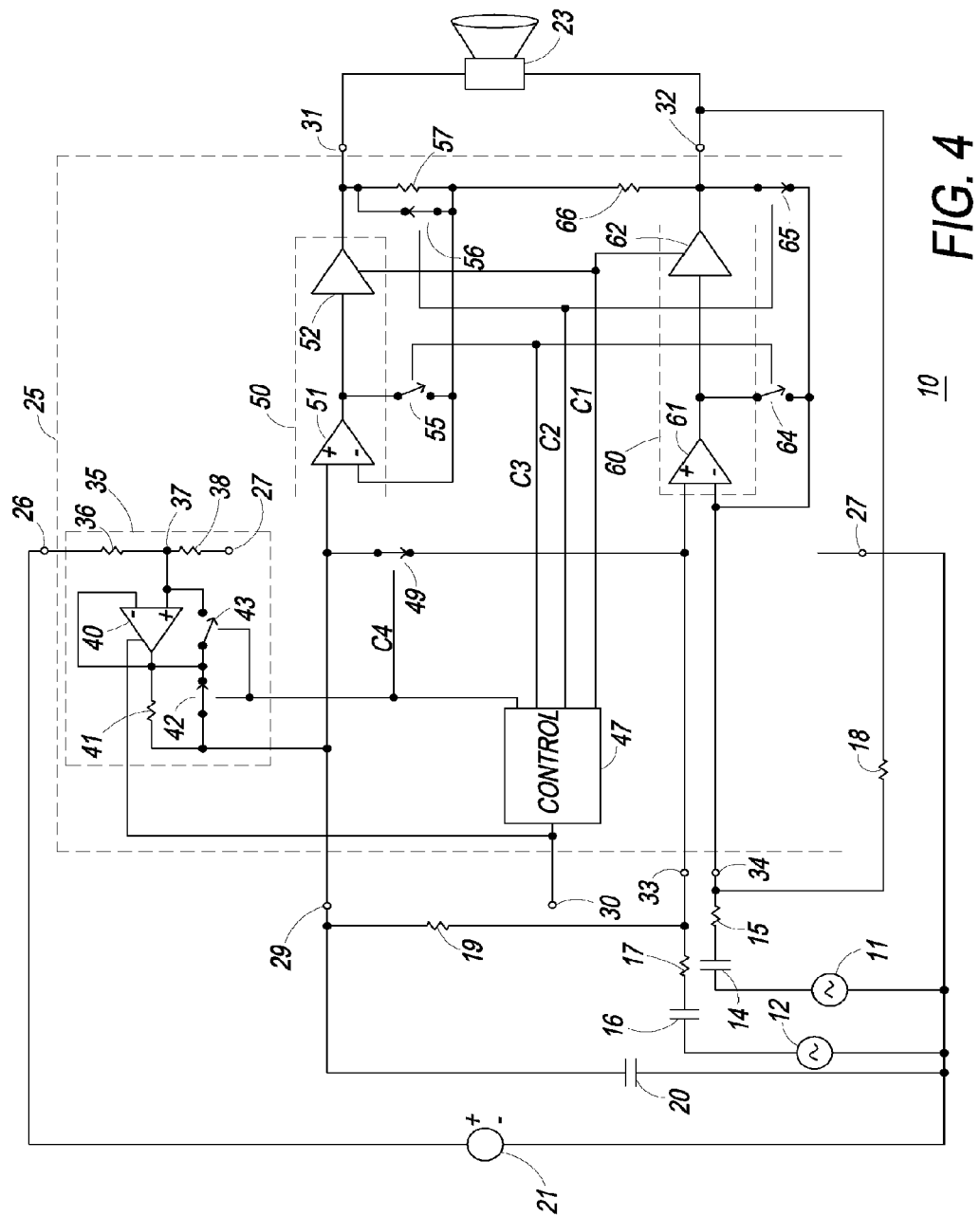

FIG. 4 schematically illustrates system 10 during the second operating state of the startup sequence of circuit 25. In FIG. 4, transistors 42, 43, 49, 55, 56, 64, and 65 are illustrated by switches that show the state (enabled or disabled) of the respective transistors responsively to the control signals of control 47. Referring to FIG. 2 and FIG. 4, at a time T1 control 47 forces the C1, C2, and C4 control signals high and the C3 control signal low in order to place circuit 25 in the second operating state. The high C1 control signal enables the outputs of amplifiers 52 and 62 and removes the outputs from the high impedance state so that amplifiers 52 and 62 may drive respective outputs 31 and 32. The high C2 control signal enables transistors 56 and 65 while the low C3 control signal disables transistors 55 and 64. The high C4 control signal maintains transistors 42 and 49 in the enabled condition and transistor 43 in the disabled state. This places amplifiers 50 and 60 in a unity gain configuration. Also, buffer 35 continues to form the voltage on input 29 to maintain capacitors 14, 16, and 20 at the voltage of node 37. Because capacitors 14, 16, and 20 are all held at substantially the same voltage by buffer 35 and transistors 49 and 65, the output of amplifiers 50 and 60 are substantially equal and no current is driven through speaker 23. Control 47 maintains circuit 25 in this second operating state for a time interval that is sufficient to enable the outputs of amplifiers 52 and 62 and ensure that amplifiers 52 and 62 are able to drive speaker 23. In this configuration of the second operating state, the gain of any differential signal through the path from inputs 33 or 34 to outputs 31 and 32 is close to unity. Since the voltage difference between the inputs of amplifiers 50 and 60 is nearly zero, no differential signal is received by speaker 23, thus, no audible noise can be heard from speaker 23.

In one embodiment, this second time interval is approximately four to five (4-5) micro-seconds. Subsequently, control 47 changes the state of the control signals to place circuit 25 in the third operating state.

Figure 5:
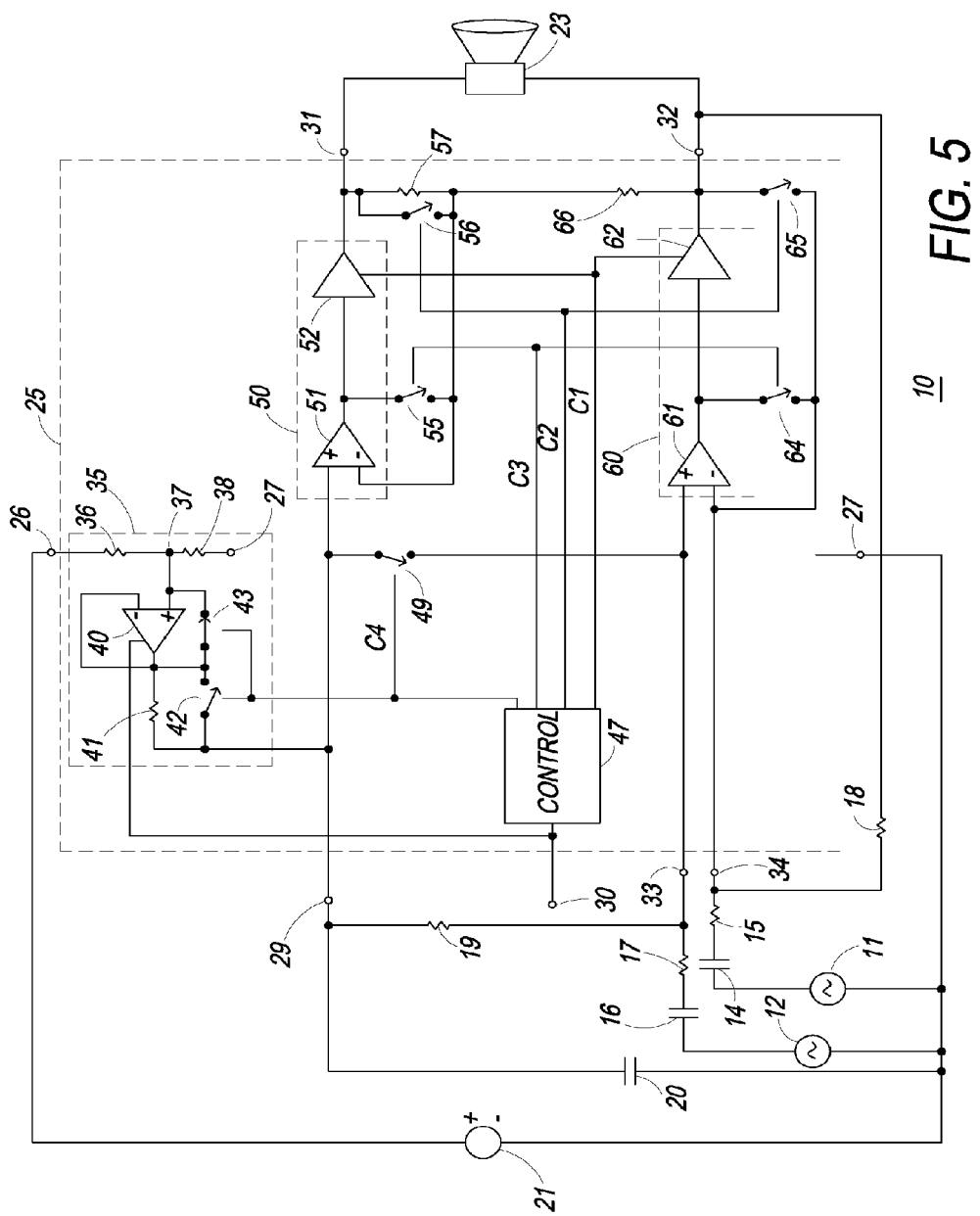

FIG. 5 schematically illustrates system 10 during the third operating state. In FIG. 5, transistors 42, 43, 49, 55, 56, 64, and 65 are illustrated by switches that show the state (enabled or disabled) of the respective transistors responsively to the control signals of control 47. Referring to FIG. 2 and FIG. 5, at a time T2 control 47 forces the C1 control signal high and the C2, C3, and C4 control signals low. The low C4 control signal disables transistor 42 and enables transistor 43 which routes the voltage from node 37 around amplifier 40 through resistor 41 to input 29. Thus, input 29 is maintained at the value of the voltage on node 37 and amplifier 40 may be disabled and to not drive input 29. The low C4 signal also disables transistor 49 and decouples capacitors 14 and 16 from input 29, thus, sources 11 and 12 can now form input signals at respective inputs 33 and 34. The high C1 control signal maintains the output of amplifiers 52 and 62 in the enabled state. The low C2 and C3 control signals disable transistors 55, 56, 64, and 65. With transistors 55 and 56 disabled, feedback resistor 57 is connected as a gain resistor between the output and input of amplifier 50. With transistors 64 and 65 disabled, amplifier 60 receives differential input signals from inputs 33 and 34 and drives output 32. Amplifier 50 receives the output of amplifier 60 through the gain of resistors 57 and 66 and receives the reference voltage from input 29 and responsively drives output 31. In this configuration, the gain of any differential input signal received from sources 11 and 12 to the differential output signal between outputs 31 and 32 is shown by the equation below:

$$V31-V32 = 2(V11-V12)((R18)/(R15))$$

where;
V11=the voltage from source 11;
V12=the voltage from source 12; and
R15=the resistance of R15.

In order to facilitate this functionality for circuit 25, input 29 is commonly connected to a first terminal of resistor 41, a source of transistor 42, a drain of transistor 49, and a non-inverting input of amplifier 51. A second terminal of resistor 41 is commonly connected to an inverting input of amplifier 40, an output of amplifier 40, a drain of transistor 42, and a source of transistor 43. A drain of transistor 43 is commonly connected to a non-inverting input of amplifier 40, node 37, a first terminal of resistor 38, and a first terminal of resistor 36. A second terminal of resistor 38 is connected to return 27 and a second terminal of resistor 36 is connected to input 26. A gate of transistor 43 is connected to an output of inverter 44. An input of inverter 44 is connected to a gate of transistor 42, a gate of transistor 49, and the C4 output of control 47. A source of transistor 49 is connected to input 33 and to a non-inverting input of amplifier 61. An inverting input of amplifier 61 commonly connected to input 34, a source of transistor 64, and a source of transistor 65. An output of amplifier 61 is connected to a drain of transistor 64, and to a non-inverting input of amplifier 62. An output of amplifier 62 is connected to a drain of transistor 65, to output 32, and to a first terminal of resistor 66. A second terminal of resistor 66 is commonly connected to a first terminal of resistor 57, a source of transistor 56, a source of transistor 55, and an inverting input of amplifier 51. An output of amplifier 51 is connected to a drain of transistor 55 and to a non-inverting input of amplifier 52. An output of amplifier 52 is commonly connected to output 31, a second terminal of resistor 57, and a source of transistor 56. A gate of transistor 56 is commonly connected to a gate of transistor 65 and the C2 output of control 47. A gate of transistor 55 is commonly connected to the gate of transistor 64 and the C3 output of control 47. The C1 output of control 47 is commonly connected to the enable input of amplifier 52 and the enable input of amplifier 62. An input of control 47 is connected to input 30.

Those skilled in the art will appreciate that during the first operating state illustrated in FIG. 3, the outputs of amplifiers 50 and 60 are disabled so that amplifiers 50 and 60 are not connected in a configuration that has any gain or gain control elements. During this operating state, the outputs of amplifiers 51 and 61 are clamped to the reference voltages used for respective subsequent stages 52 and 62, thus, the outputs of amplifiers 51 and 61 do not follow the voltage from buffer 35.

Figure 6:
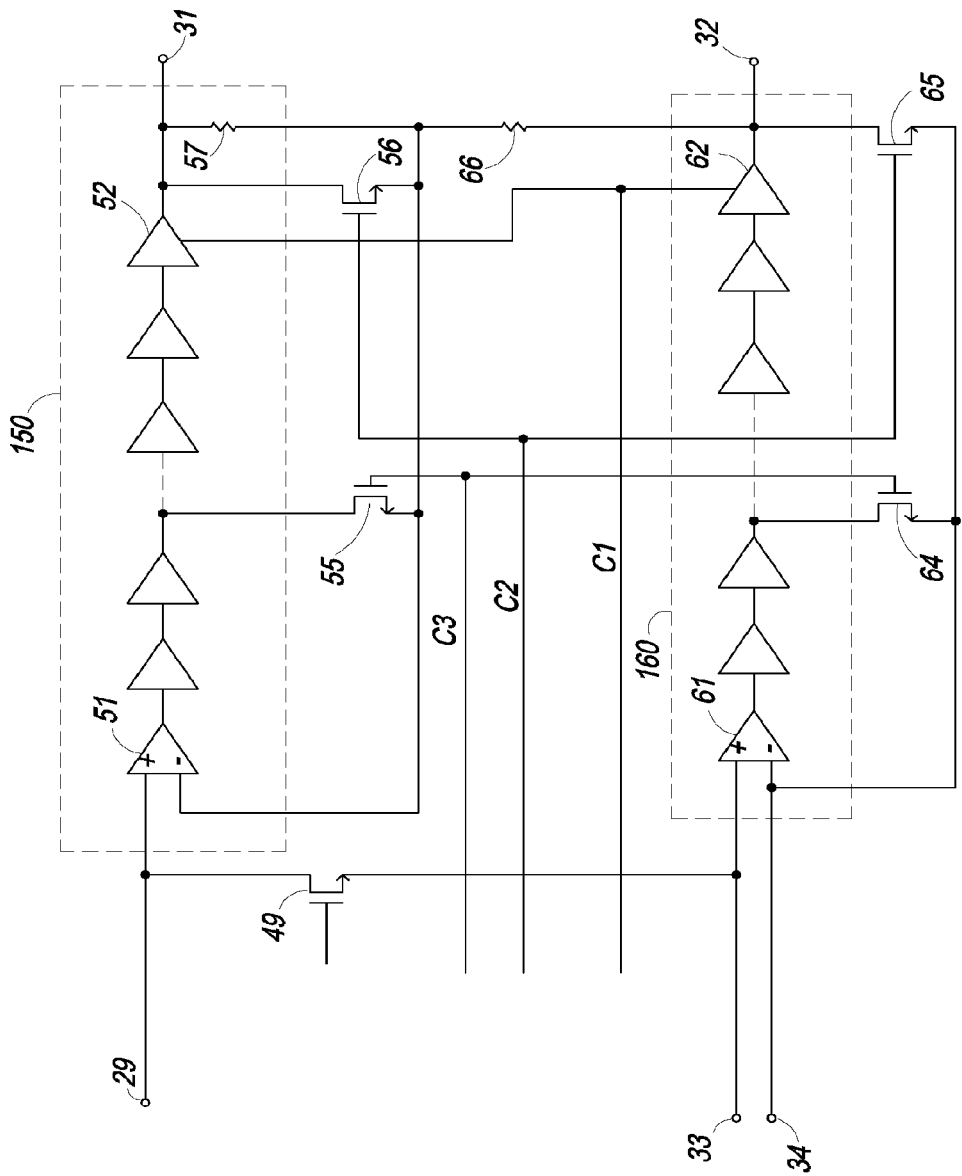
FIG. 6 schematically illustrates an alternate embodiment of portions of the amplifier circuit of FIG. 1 in accordance with the present invention.

FIG. 6 schematically illustrates a portion of an embodiment of a multi-stage amplifier 150 and a multi-stage amplifier 160 that are alternate embodiments of respective amplifiers 50 and 60 that are illustrated in FIG. 1. Amplifier 150 illustrates various other amplification stages that may be positioned in series between amplifiers 51 and 52. Transistor 55 is illustrated in FIG. 6 as being coupled to the output of a second amplification stage after amplifier 51. However, transistor 55 may be connected to the output of any amplifier stage that is positioned between the output of amplifier 51 and the input of amplifier 52. Amplifier 160 similarly illustrates various other amplification stages that may be positioned in series between amplifiers 61 and 62.

Figure 7:
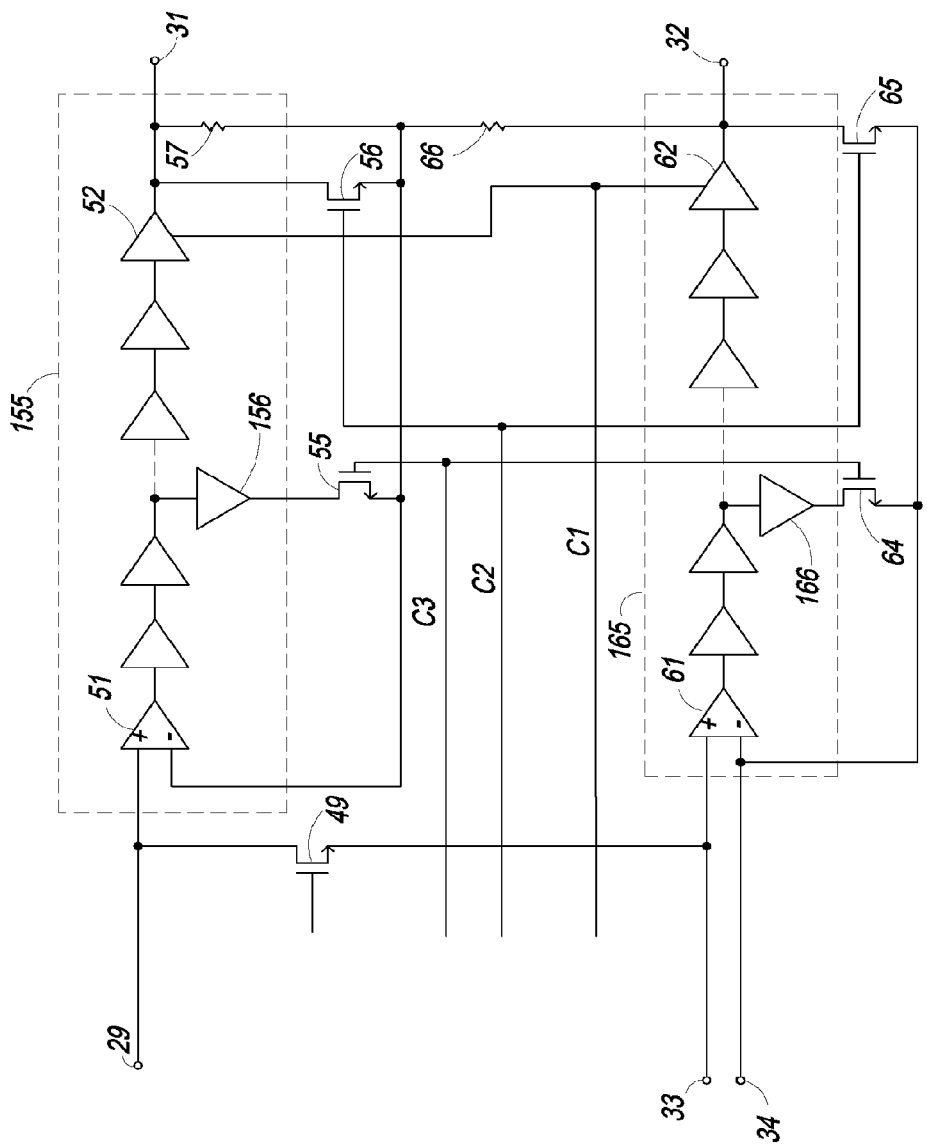
FIG. 7 schematically illustrates another alternate embodiment of portions of the amplifier circuit of FIG. 1 in accordance with the present invention.

FIG. 7 schematically illustrates a portion of an embodiment of a multi-stage amplifier 155 and a multi-stage amplifier 165 that are alternate embodiments of respective amplifiers 50 and 60 that are illustrated in FIG. 1 and of respective amplifiers 150 and 160 that are illustrated in FIG. 6. Amplifier 155 is similar to amplifier 150 however amplifier 155 has an additional amplification stage of an amplifier 156 that is inserted between the output of one of the series connected amplifiers and transistor 55. Amplifier 156 provides buffering between the output of the series connected amplifiers and transistor 55. Similarly, amplifier 165 includes an amplifier 166 that is positioned and that functions similarly to amplifier 156.

Figure 8:
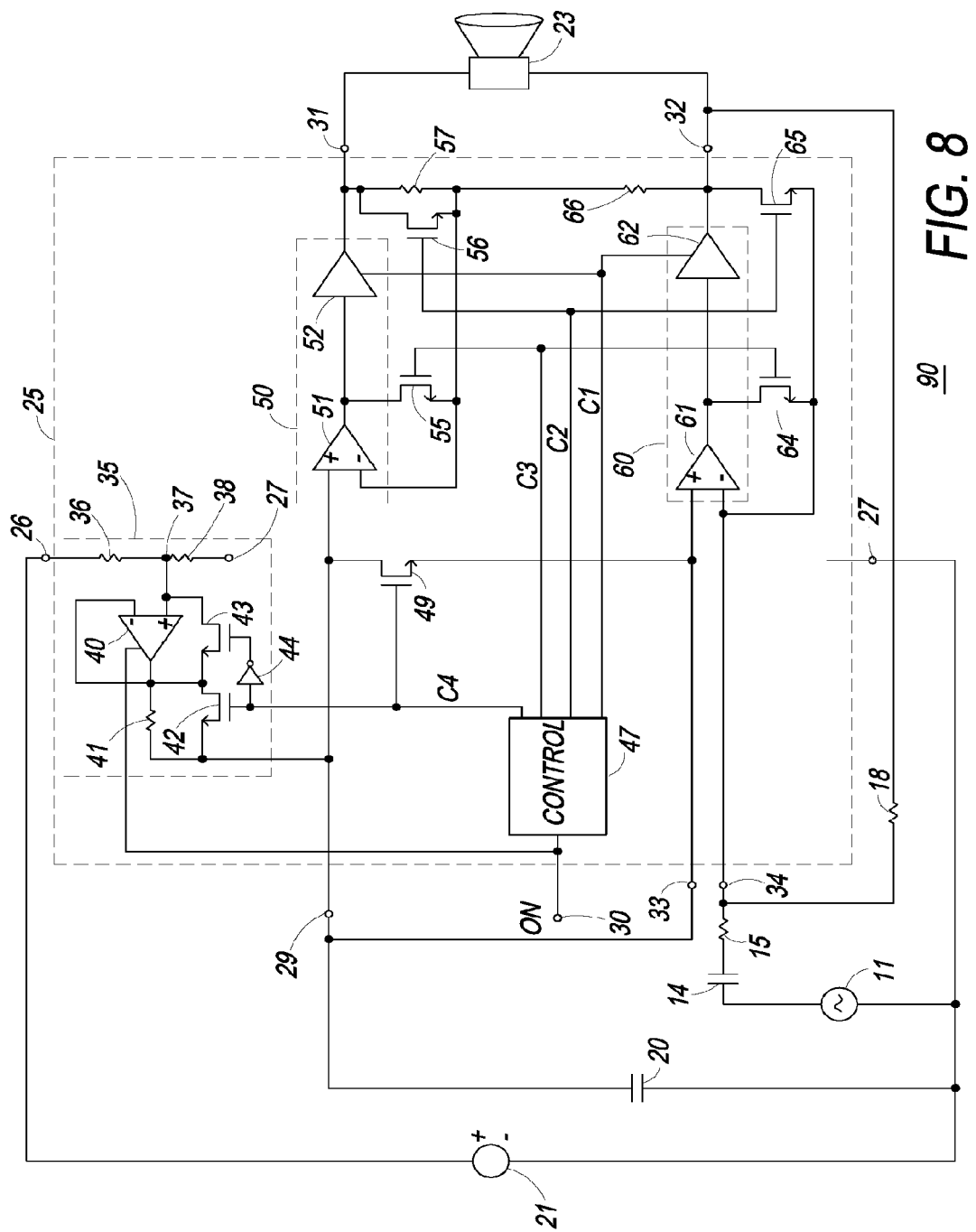
FIG. 8 schematically illustrates an embodiment of a portion of another system that uses the amplifier circuit of FIG. 1 in a different configuration in accordance with the present invention.

FIG. 8 schematically illustrates an embodiment of a portion of a single-ended amplifier system 90 that uses amplifier circuit 25 in a single-ended configuration to amplify single-ended signals. Amplifier circuit 25 functions the same as described for differential amplifier system 10 of FIG. 1.

In this configuration, the gain of any differential signal received from sources 11 and 12 to the differential output signal between outputs 31 and 32 is shown by the equation below:

$$V31 - V32 = 2(V11 - V12)((R18)/(R15))$$

where;

R15=the resistance of R15.

Figure 9:
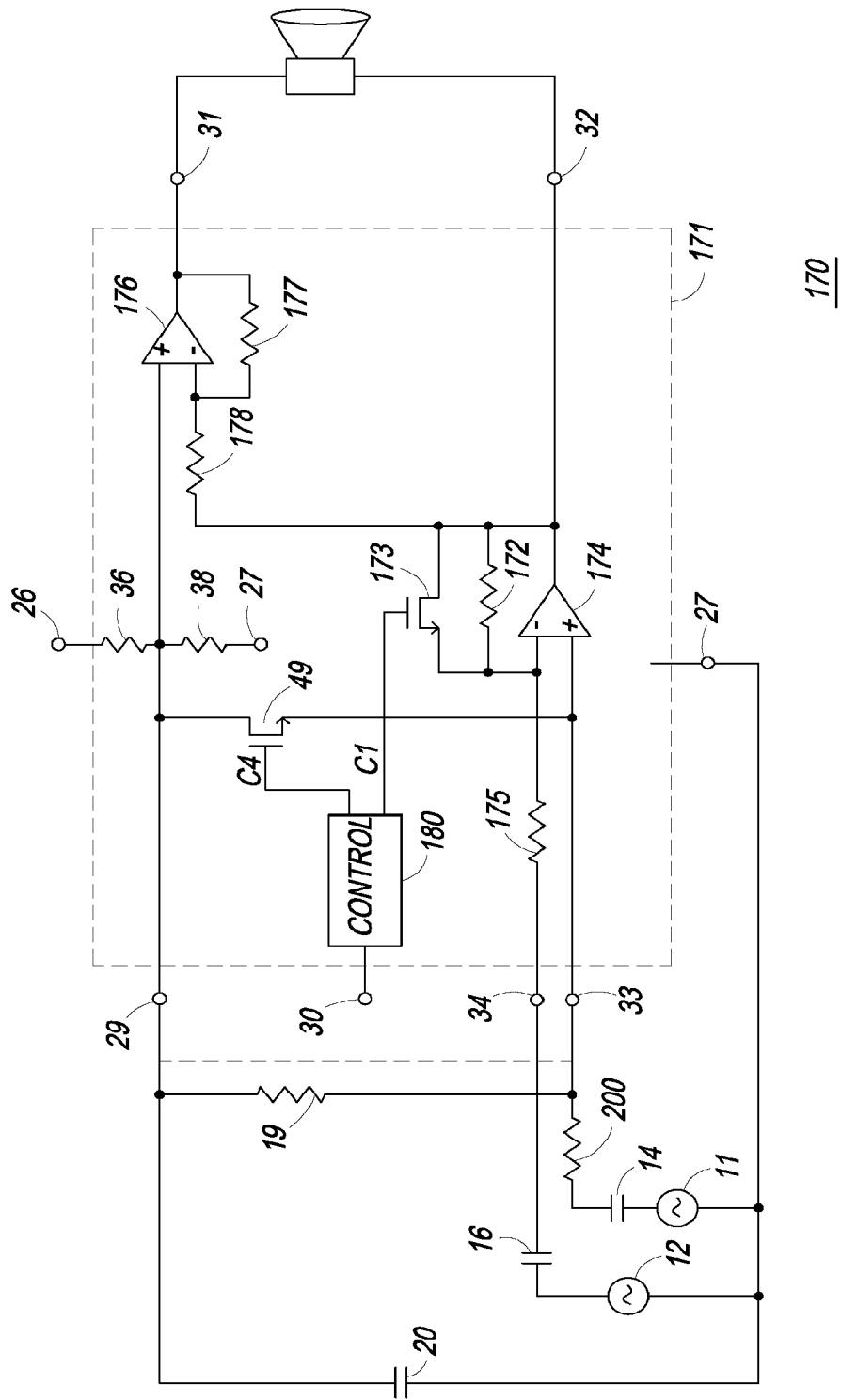
FIG. 9 schematically illustrates an embodiment of a portion of another system that has an exemplary embodiment of another amplifier circuit in accordance with the present invention.

FIG. 9 schematically illustrates an embodiment of a portion of an amplifier system 170 which includes an exemplary embodiment of another amplifier circuit 171 that uses a time-based algorithm to charge bypass capacitor 20. Amplifier circuit 171 includes a first amplifier 174, a second amplifier 176, and a clock control circuit or control 180. Control 180 is an alternate embodiment of control 47 of FIG. 1. Control 180 is similar to control 47 except that control 180 may be configured to form fewer operating states than control 47. Amplifiers 174 and 176 generally are formed as differential amplifiers, such as operational amplifiers that include feedback and gain resistors such as feedback resistors 172 and 177 and gain resistors 175, 178 and 200. A switch, such as a transistor 173, is connected across resistor 172 to assist in charging capacitor 16. For the exemplary embodiment illustrated in FIG. 9, control signal C1 is used to control transistor 173 and control signal C4 is used to control transistor 49. During the first operating state, control 180 asserts the C1 and C4 signals. Signal C1 enables transistor 173 and signal C4 enables transistor 49 so that capacitors 14, 16, and 20 may be charged to the reference voltage formed by resistors 36 and 38. Bypass buffer 35 (FIG. 1) may also be used to charge capacitors 14, 16, and 20 at a faster rate. The time interval of the first operating state is chosen to be long enough to ensure that capacitors 14, 16, and 20 become charged to the desired value of the voltage formed by resistors 36 and 38. After the first time interval expires, control 47 negates the C1 and C4 control signals so that amplifiers 174 and 176 may drive outputs 31 and 32 with the amplified signal received from capacitors 14 and 16. In another embodiment, system 170 may be coupled in a single ended configuration by omitting capacitor 14, resistors 19 and 200, and signal 11 in addition to connecting input 33 to input 29 as illustrated by a dashed line.

Figure 10:
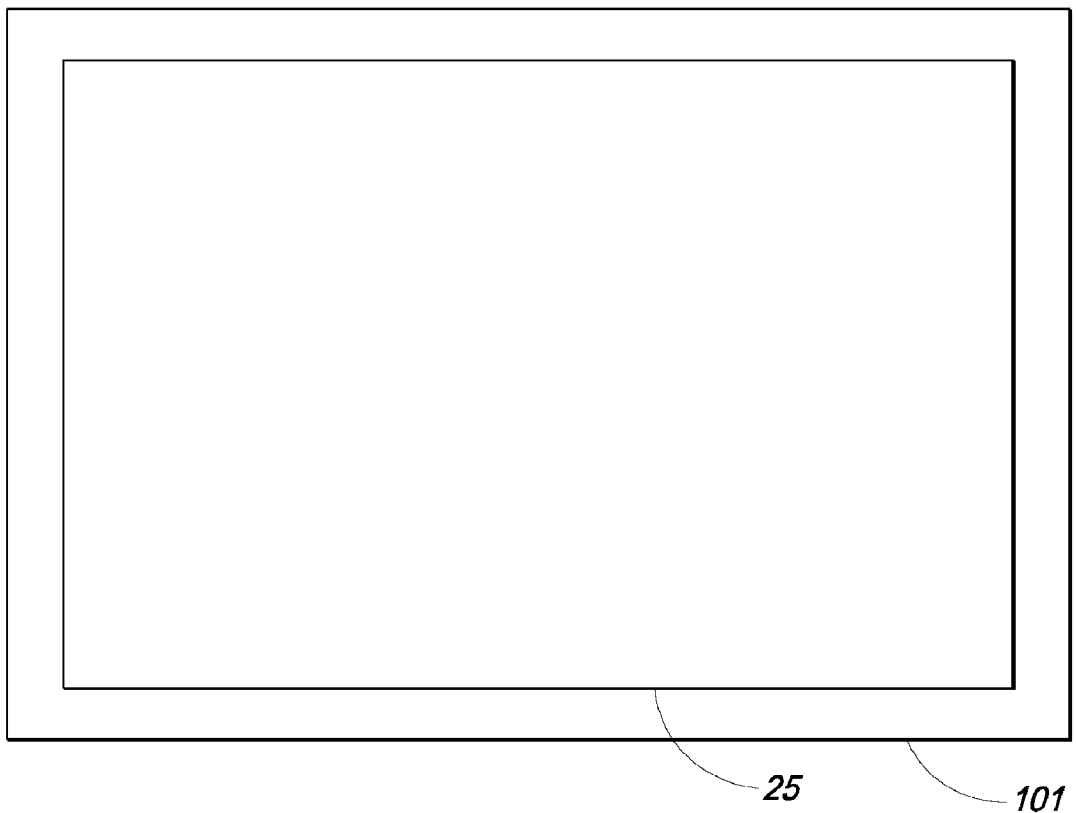
FIG. 10 illustrates an enlarged plan view of a semiconductor device that includes the amplifier circuit of FIG. 1 in accordance with the present invention.

FIG. 10 schematically illustrates an enlarged plan view of a portion of an embodiment of a semiconductor device or integrated circuit 100 that is formed on a semiconductor die 101. Circuits 25 is formed on die 101. Die 101 may also include other circuits that are not shown in FIG. 8 for simplicity of the drawing. Circuit 25 and device or integrated circuit 100 are formed on die 101 by semiconductor manufacturing techniques that are well known to those skilled in the art.

In view of all of the above, it is evident that a novel device and method is disclosed. Included, among other features, is configuring an amplifier circuit to disable an output stage of an amplifier while an intermediate gain stage of the amplifier circuit is used to reduce noise on the output of the amplifier circuit, and particularly while charging reference and input capacitances of the amplifier circuit. Also included is configuring the amplifier circuit to form a plurality of operating states that are also used to stabilize the elements.

While the subject matter of the invention is described with specific preferred embodiments, it is evident that many alternatives and variations will be apparent to those skilled in the semiconductor arts. Additionally, the word "connected" is used throughout for clarity of the description, however, it is intended to have the same meaning as the word "coupled". Accordingly, "connected" should be interpreted as including either a direct connection or an indirect connection.

The invention claimed is:

1. An amplifier circuit comprising:
a first multi-stage amplifier having a first amplifier and a second amplifier, the first amplifier having a first input, a second input and an output, the second amplifier having a first input and having an output coupled to a first output of the amplifier circuit, wherein the second amplifier is configured to place the output of the second amplifier in a high impedance state responsively to a first control signal;
a second multi-stage amplifier having a third amplifier and a fourth amplifier, the third amplifier having a first input, a second input and an output, the fourth amplifier having a first input and having an output coupled to a second output of the amplifier circuit, wherein the fourth amplifier is configured to place an output of the fourth amplifier in a high impedance state responsively to the first control signal;
the first input of the first amplifier coupled to receive a first signal to be amplified and wherein the first multi-stage amplifier is configured to have a first resistor coupled from the output of the second amplifier to the first input of the first amplifier;
a first switch coupled in parallel with the first resistor;
a second resistor coupled from the output of the fourth amplifier to the first input of the third amplifier;
a second switch coupled in parallel with the second resistor; and
a third switch coupled between the second input of the first amplifier and the second input of the third amplifier.

2. The amplifier circuit of claim 1 wherein the second input of the first amplifier is configure to receive a second signal to be amplified.

3. The amplifier circuit of claim 1 wherein the second input of the third amplifier is configure to be coupled to a capacitor.

4. The amplifier circuit of claim 3 further including a third switch coupled from the output of the third amplifier to the first input of the third amplifier.

5. The amplifier circuit of claim 4 further including a control circuit configured to form multi-phase control signals including the first control signal, a second control signal, and a third control signal, the control circuit configured to assert the third control signal to close the third switch while negating the second control signal to open the first switch and the second switch and while negating the first control signal to place the output of the second amplifier and the output of the fourth amplifier in the high impedance state.

6. The amplifier circuit of claim 5 wherein the control circuit is configured to negate the third control signal to open the third switch while asserting the second control signal to close the first switch and the second switch and while asserting the first control signal to remove the output of the second amplifier and the output of the fourth amplifier from the high impedance state.

7. The amplifier circuit of claim 5 further including a fourth switch operably coupled between the output of the first amplifier and the first input of the first amplifier to be enabled responsively to the third control signal.

8. The amplifier circuit of claim 6 further including a fifth switch operably coupled between the first input of the first amplifier and the first input of the third amplifier to be enabled responsively to a fourth control signal of the control circuit.

9. An amplifier circuit comprising:
a first multi-stage amplifier having a first amplifier and a second amplifier, the first amplifier having a first input, a second input and an output, the second amplifier having a first input and having an output coupled to a first output of the amplifier circuit, wherein the second amplifier is configured to place the output of the second amplifier in a high impedance state responsively to a first control signal;

a second multi-stage amplifier having a third amplifier and a fourth amplifier, the third amplifier having a first input, a second input and an output, the fourth amplifier having a first input and having an output coupled to a second output of the amplifier circuit, wherein the fourth amplifier is configured to place an output of the fourth amplifier in a high impedance state responsively to the first control signal;

the first input of the first amplifier coupled to receive a first signal to be amplified and wherein the first multi-stage amplifier is configured to have a first resistor coupled from the output of the second amplifier to the first input of the first amplifier;

a first switch coupled in parallel with the first resistor;

a second resistor coupled from the output of the fourth amplifier to the first input of the third amplifier;

a second switch coupled in parallel with the second resistor;

a fifth amplifier having a first input coupled to receive a fixed signal, and a second input coupled to an output of the fifth amplifier;

a third switch coupled from the first input to the output of the fifth amplifier;

a third resistor coupled from the output of the fifth amplifier to the second input of the third amplifier; and a fourth switch coupled in parallel with the third resistor.

10. A method of forming an amplifier circuit comprising:
forming a first multi-stage amplifier having a first amplifier and a second amplifier, the first amplifier having a first input, a second input, and an output, the second amplifier having an input and an output wherein the output of the first amplifier is coupled to the input of the second amplifier;

forming a second multi-stage amplifier having a third amplifier and a fourth amplifier, the third amplifier having a first input, a second input, and an output, the fourth amplifier having an input and an output wherein the output of the third amplifier is coupled to the input of the fourth amplifier;

coupling the output of the second amplifier to a first output of the amplifier circuit and coupling the output of the fourth amplifier to a second output of the amplifier circuit; and configuring the amplifier circuit to form a first operating state and selectively place the output of the second and fourth amplifiers in a high impedance state, couple a signal from the output of the first amplifier to the first input of the first amplifier and couple a signal from the output of the third amplifier to the first input of the third amplifier responsively to the first operating state including configuring the amplifier circuit to selectively couple the second input of the first amplifier to the second input of the third amplifier responsively to the first operating state and to selectively decouple the second input of the first amplifier from the second input of the third amplifier subsequently to the first operating state.

11. A method of forming an amplifier circuit comprising:
forming a first multi-stage amplifier having a first amplifier and a second amplifier, the first amplifier having a first input, a second input, and an output, the second amplifier having an input and an output wherein the output of the first amplifier is coupled to the input of the second amplifier;

forming a second multi-stage amplifier having a third amplifier and a fourth amplifier, the third amplifier having a first input, a second input, and an output, the fourth amplifier having an input and an output wherein the output of the third amplifier is coupled to the input of the fourth amplifier;

coupling the output of the second amplifier to a first output of the amplifier circuit and coupling the output of the fourth amplifier to a second output of the amplifier circuit;

configuring the amplifier circuit to form a first operating state and selectively place the output of the second and fourth amplifiers in a high impedance state, couple a signal from the output of the first amplifier to the first input of the first amplifier and couple a signal from the output of the third amplifier to the first input of the third amplifier responsively to the first operating state; and configuring the amplifier circuit to form a second operating state and responsively decouple the output of the second and fourth amplifiers from the high impedance state, to responsively couple a signal from the output of the second amplifier to the first input of the first amplifier, and to responsively couple a signal from the output of the fourth amplifier to the first input of the third amplifier.

12. The method of claim 11 further including configuring the amplifier circuit to form a third operating state subsequently to the second operating state and responsively decouple the signal from the output of the second amplifier from the first input of the first amplifier, and to responsively decouple the signal from the output of the fourth amplifier from the first input of the third amplifier.

13. The method of claim 12 wherein configuring the amplifier circuit to form the third operating state includes configuring the amplifier circuit to decouple the second input of the first amplifier from the second input of the third amplifier responsively to the third operating state.

14. A method of forming an amplifier circuit comprising:
forming a first amplifier having a first input, a second input, and having an output coupled to a first output of the amplifier circuit;

forming a second amplifier having a first input, a second input, and having an output coupled to a second output of the amplifier circuit; and configuring the amplifier circuit to form a first operating state and selectively couple a signal from the output of the first amplifier to the first input of the first amplifier responsively to the first operating state wherein the second input of the first amplifier is configured to receive a reference signal, and the amplifier circuit configured to selectively couple a signal from the output of the second amplifier to the first input of the second amplifier and to selectively couple the reference signal to the second input of the second amplifier responsively to the first operating state; and configuring the amplifier circuit to form another state subsequent to the first state wherein the first and second inputs of the second amplifier are decoupled from receiving the reference signal.

15. The method of claim 14 further including configuring the amplifier circuit to form a second operating state and responsively decouple the signal from the output of the first amplifier from the first input of the first amplifier and to responsively decouple the signal from the output of the second amplifier from the first input of the second amplifier.

16. A method of forming an amplifier circuit comprising:
forming a first amplifier having a first input, a second input, and having an output coupled to a first output of the amplifier circuit;
forming a second amplifier having a first input, a second input, and having an output coupled to a second output of the amplifier circuit; and
configuring the amplifier circuit to form a first operating state and selectively couple a signal from the output of the first amplifier to the first input of the first amplifier responsively to the first operating state and to selectively couple a signal from the output of the second amplifier to the first input of the second amplifier responsively to the first operating state; and
configuring the amplifier circuit to selectively couple the second input of the first amplifier to the second input of the second amplifier responsively to the first operating state and to selectively decouple the second input of the first amplifier from the second input of the second amplifier subsequently to the first operating state.

* * * * *